US005883544A

United States Patent [19]

So et al.

[11] Patent Number: 5,883,544

[45] Date of Patent: Mar. 16, 1999

[54] INTEGRATED CIRCUIT ACTIVELY BIASING THE THRESHOLD VOLTAGE OF TRANSISTORS AND RELATED METHODS

[75] Inventors: Jason Siucheong So; Tsiu Chiu Chan, both of Carrollton, Tex.

[73] Assignee: STMicroelectronics, Inc., Carrollton, Tex.

[21] Appl. No.: 758,930

[22] Filed: Dec. 3, 1996

[51] Int. Cl.[6] .................... H03K 17/30

[52] U.S. Cl. .................... 327/537; 327/543; 327/544; 327/546; 365/189.09

[58] Field of Search .................... 327/530, 534, 327/535, 537, 538, 543, 545, 546, 544, 542; 365/189.01, 226, 227, 189.09

[56] References Cited

U.S. PATENT DOCUMENTS

| | | | |
|---|---|---|---|
| 3,609,414 | 9/1971 | Pleshko | 327/543 |
| 4,142,114 | 2/1979 | Green | 327/534 |
| 4,435,652 | 3/1984 | Stevens | 327/541 |
| 4,458,212 | 7/1984 | Brehmer et al. | 330/260 |
| 4,775,959 | 10/1988 | Sato et al. | 365/189.09 |
| 4,791,318 | 12/1988 | Lewis et al. | 327/537 |
| 4,933,827 | 6/1990 | Olivo et al. | 363/60 |
| 4,985,869 | 1/1991 | Miyamoto | 365/222 |
| 4,987,088 | 1/1991 | Bergonzoni et al. | 438/217 |
| 5,099,146 | 3/1992 | Miki et al. | 327/537 |
| 5,099,148 | 3/1992 | McClure et al. | 326/86 |
| 5,303,189 | 4/1994 | Devin et al. | 365/189.18 |
| 5,397,934 | 3/1995 | Merrill et al. | 327/537 |
| 5,682,118 | 10/1997 | Kaenel et al. | 327/534 |

*Primary Examiner*—Timothy P. Callahan
*Assistant Examiner*—Terry L. Englund
*Attorney, Agent, or Firm*—Theodore E. Galanthay; Lisa K. Jorgenson; Christopher F. Regan

[57] ABSTRACT

An integrated circuit includes a plurality of MOSFETs having channels of a first conductivity type, and having active control of an effective threshold voltage of the MOSFETs to be less than an absolute value of an initial threshold voltage. In this embodiment, a first MOSFET has a channel of the first conductivity type, and a second MOSFET is connected to the first MOSFET and has a channel of a second conductivity type. The second MOSFET is preferably biased to a pinch-off region and cooperates with the first MOSFET for generating a control signal related to an effective threshold voltage of the first MOSFET. Moreover, the circuit preferably generates a bias voltage to the plurality of MOSFETs and to the first MOSFET based upon the control signal to set an effective threshold voltage of the plurality of MOSFETs to have an absolute value less than an absolute value of the initial threshold voltage and, more preferably, to a reference voltage. Accordingly, lower supply voltages can be readily accommodated. In another embodiment, the biasing is only provided to activated circuit portions.

36 Claims, 2 Drawing Sheets

INTEGRATED CIRCUIT ACTIVELY BIASING THE THRESHOLD VOLTAGE OF TRANSISTORS AND RELATED METHODS

FIELD OF THE INVENTION

The present invention relates to the field of semiconductors, and more particularly, to an integrated circuit comprising a plurality of metal-oxide semiconductor field-effect transistors (MOSFETs), and related methods.

BACKGROUND OF THE INVENTION

Integrated circuits are widely used in many electronic devices. A typical relatively complicated integrated circuit may include hundreds of thousands or millions of transistors on a substrate. One type of transistor commonly used in an integrated circuit is the metal-oxide semiconductor field-effect transistor (MOSFET). A MOSFET includes source and drain regions connected by a channel. A gate overlies the channel and is separated therefrom by an insulating layer, such as typically provided by silicon dioxide ($SiO_2$). A control voltage applied to the gate controls the flow of charge carriers through the channel between the source and drain.

A depletion-mode MOSFET includes a doped or conducting channel under the gate with no voltage applied to the gate. An enhancement-mode MOSFET, in contrast, requires that a gate-to-source bias voltage be applied to create an inversion layer to serve as a conducting channel. This voltage is the threshold voltage Vt. For an n-channel enhancement-mode MOSFET a positive voltage between the gate and source induces the channel. Thus, the current will only flow when the gate-to-source voltage exceeds the threshold voltage Vt. Similarly, for a p-channel enhancement-mode MOSFET, current flows when the gate-to-source voltage is negative below the negative threshold voltage.

The threshold voltage of an enhancement-mode MOSFET is determined by a number of factors, such as the channel length, channel width, doping, gate oxide thickness, etc. Extrinsic factors, such as the ambient temperature, also affect the threshold voltage. If the Vt value is too low for a desired supply voltage, the transistor may have unacceptable leakage current if the supply voltage is greater than the desired supply voltage. Conversely, if the Vt is chosen relatively high, then there is a reduced likelihood that the transistor will fully switch on. Although modern semiconductor manufacturing process can be controlled, there is still a spread of Vt values across integrated circuit dies within production runs.

It may also be desirable to use lower supply voltages for MOSFET integrated circuits to thereby reduce power consumption, such as for a cellular phone powered by a rechargeable battery, for example. Since the spread of threshold voltages based upon process variations is about the same irrespective of the supply voltage, Vt becomes a larger percentage as the supply voltage is reduced. As the supply voltage is reduced, control over Vt and the spread thereof for the transistors becomes more critical. When the supply voltages are reduced to about 1 volt or below, without accurate control of Vt, fewer and fewer integrated circuits may be acceptable as yields decrease. Analog circuits may be particularly susceptible to variations in Vt.

U.S. Pat. No. 4,142,114 to Green, for example, discloses regulation of Vt for a plurality of MOSFETs on a common substrate which is achieved by adjusting the back bias on the substrate using a charge pump that is selectively operated when the Vt of a designated enhancement-mode FET falls below a reference voltage. A voltage divider provides the reference voltage that is applied to the gate of the designated enhancement-mode MOSFET, which when turned on enables the charge pump. The Vt of a designated enhancement-mode MOSFET is detected by applying a reference voltage to its gate. The charge pump raises the Vt of the MOSFETs on the substrate to within a predetermined range of a reference voltage. In other words, the patent discloses an example of so-called negative back gate bias, wherein the Vt of the transistors is raised. Unfortunately, raising the Vt reduces the available voltage headroom and prevents operating at lower supply voltages. Moreover, the sensing and charge pump circuit components include MOSFETs which have Vt's, that is, the variable to be controlled. In addition, a high effective threshold voltage may result in damage to relatively thin gate oxide layers of the MOSFETs.

U.S. Pat. No. 5,397,934 to Merrill et al. also discloses a compensation circuit for the threshold voltages of a plurality of MOSFETS on an integrated circuit die. In particular, a portion of the circuit generates a reference voltage. Threshold voltage monitoring circuitry includes a MOSFET transistor and a resistor connected in series therewith to generate a second voltage signal. Feedback circuitry compares the reference voltage to the second voltage signal and adjusts the effective threshold voltage of the MOS transistor so that the reference voltage is substantially equal to the second voltage signal. As described above, the compensation circuitry includes devices which are themselves subject to the variation in threshold voltage.

SUMMARY OF THE INVENTION

In view of the foregoing background, it is therefore an object of the present invention to provide an integrated circuit having MOSFETS with accurately compensated effective threshold voltages to facilitate operation at relatively low power supply voltages.

This and other objects, features and advantages in accordance with the present invention are provided by an integrated circuit including a plurality of MOSFETs having channels of a first conductivity type, and a circuit providing active control of an effective threshold voltage of the MOSFETs to be less than an absolute value of an initial threshold voltage. In one embodiment, a first MOSFET has a channel of the first conductivity type, and a second MOSFET, connected to the first MOSFET, has a channel of a second conductivity type. The second MOSFET is preferably biased to a pinch-off region and cooperates with the first MOSFET for generating a control signal related to an effective threshold voltage of the first MOSFET. Moreover, the circuit preferably includes effective threshold bias means for generating a bias voltage to the plurality of MOSFETs and to the first MOSFET based upon the control signal to set an effective threshold voltage of the plurality of MOSFETs to have an absolute value less than an absolute value of the initial threshold voltage. Accordingly, lower supply voltages can be readily accommodated.

The second MOSFET preferably has a predetermined relatively long and narrow channel so as to supply current less than about 1 microampere when in the pinch-off region. More preferably, the second MOSFET may be constructed so that the current may be on the order of tens of nanoamperes to thereby increase accuracy and reduce power consumption.

The effective threshold bias means may be provided by: difference means for determining a difference between the control signal and a reference voltage, and converging bias means for generating the bias voltage responsive to the difference to thereby bias the first MOSFET and the plurality of MOSFETs to converge to an effective threshold voltage substantially equal to the reference voltage. The converging bias means preferably comprises a third MOSFET and a capacitor connected thereto, wherein the third MOSFET is controlled to charge the capacitor to control the bias voltage.

The effective threshold bias means may further include reference voltage generating means on the substrate for generating the reference voltage. For example, a resistor voltage divider may set the reference voltage. Alternately, the reference voltage may be controlled by an external signal.

In other embodiments of the invention, both conductivity type MOSFETs may be provided. In this instance, the sensing and biasing circuit portions may be duplicated for a second plurality of MOSFETs having channels of the opposite conductivity type than the first plurality of MOSFETS.

Another aspect of the invention addresses power consumption of the sensing and effective threshold biasing arrangement. In this embodiment the circuit comprises: a plurality of circuit portions with each of the circuit portions comprising a respective plurality of MOSFETs, and each MOSFET having an initial threshold voltage; processor means for selectively activating and deactivating ones of the plurality of circuit portions; and activated circuit effective threshold bias means for only biasing respective MOSFETs of activated circuit portions to set an effective threshold voltage different than an initial threshold voltage. In other words the biasing is used only when the circuit portion or portions are activated, and for not biasing respective MOSFETs of deactivated circuit portions to thereby conserve power. The threshold voltage sensing and biasing as described above, for example, may be used to bias the activated circuit portions.

A method aspect of the invention is for making and operating an integrated circuit. The method preferably comprises the steps of: forming a plurality of MOSFETs on a substrate with each having an initial threshold voltage and a channel of a first conductivity type; forming a first MOSFET on the substrate having the initial threshold voltage and a channel of the first conductivity type; generating a control signal related to an effective threshold voltage of the first MOSFET; and applying a bias voltage to the plurality of MOSFETs and to the first MOSFET based upon the control signal to set an effective threshold voltage of the first plurality of MOSFETs to have an absolute value less than an absolute value of the initial threshold voltage.

Another method in accordance with the invention is for making and operating a circuit to further reduce power consumption. The method preferably comprises the steps of: forming a plurality of circuit portions, each comprising a respective plurality of MOSFETs, and each MOSFET having an initial threshold voltage; selectively activating and deactivating ones of the plurality of circuit portions; and only biasing respective MOSFETs of activated circuit portions to set an effective threshold voltage different than an initial threshold voltage. Deactivated circuit portions are not biased to thereby conserve power.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers with prime notation refer to like elements.

Figure 1:
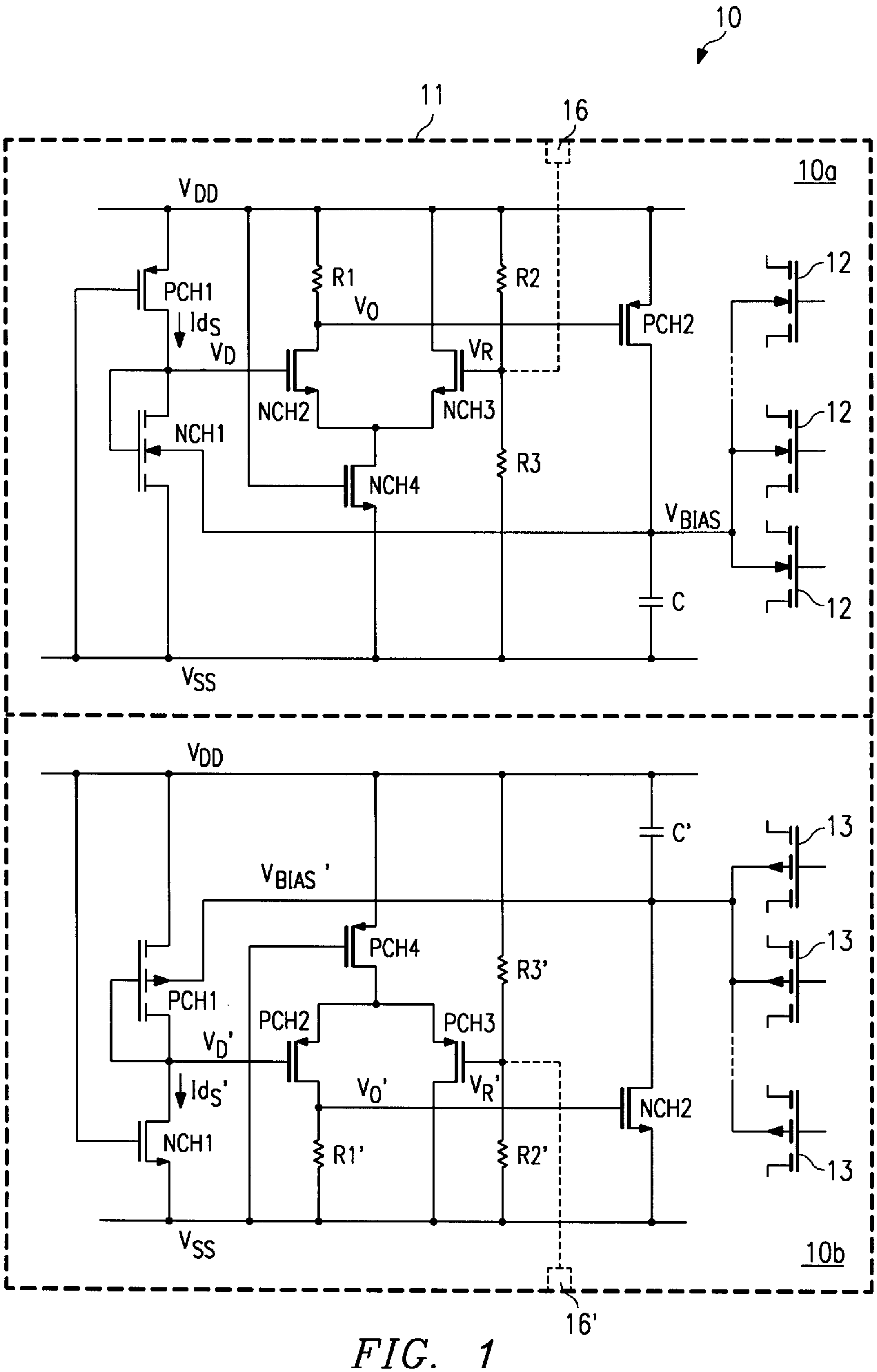
FIG. 1 is a schematic circuit diagram of an embodiment of an integrated circuit in accordance with the present invention.

Referring first to FIG. 1 an integrated circuit 10 in accordance with the present invention is first described. The integrated circuit includes a substrate 11 on which a plurality of enhancement type MOSFETs are formed as would be readily understood by those skilled in the art. The illustrated integrated circuit 10 includes both p-channel MOSFETs 13 and n-channel MOSFETs 12 in a CMOS circuit as would also be readily understood by those skilled in the art.

Each n-channel and p-channel MOSFET 12, 13 has an initial threshold voltage $Vt_{INI}$ dependent at least in part on design parameters and processing variations. An active circuit is provided for actively sensing and biasing the p-tubs or wells of the n-channel MOSFETs 12 with a voltage $V_{BIAS}$ to produce an effective threshold voltage $Vt_{EFF}$ of each MOSFET lower than the initial threshold voltage.

The lower portion of FIG. 1 illustrates a circuit **10*b* providing active sensing and biasing for the p-channel MOSFETs 13. In particular, the second sensing and biasing circuit provides a $V_{BIAS}'$ to bias the n-tubs of the p-channel MOSFETs 13** to produce an effective threshold voltage $Vt_{EFF}$ having an absolute value less than the absolute value of the negative initial threshold voltage $Vt_{INI}$.

Accordingly, the effective threshold voltages may set to below a predetermined value, and lower supply voltages ($V_{DD}$) thereby readily accommodated. In addition, the lower effective threshold voltages $Vt_{EFF}$ also permit a thinner gate oxide layer while reducing the likelihood of damaging the gate oxide.

As would be readily understood by those skilled in the art the active sensing and biasing arrangement of the present invention may be included for an integrated circuit including only n-channel or p-channel MOSFETs. In addition, the active sensing and biasing arrangement may only be needed on one or the other of n-channel or p-channel MOSFETs where both types of transistors are included in the integrated circuit. For example, the active sensing and biasing may be used to produce a lowered $Vt_{EFF}$ only on the n-channel transistors, even where p-channel devices are also included.

The upper circuit portion **10*a* of FIG. 1 will now be described in greater detail. The p-channel MOSFET PCH1 is biased so as to be always on or in the pinch-off region by connecting its source to $V_{DD}$ and its gate to $V_{SS}$ as would be readily understood by those skilled in the art. The size selection of PCH1 should provide a long and narrow channel for the gate so as to supply a relatively low current $I_{ds}$ to the sensing MOSFET NCH1. Preferably the current supplied $I_{ds}$ is less than about 1 microamp and, more preferably in the range of 10 nanoamps or less. As illustrated, the gate and drain of transistor NCH1 are connected together and to the drain of transistor PCH1. Transistors NCH1 and PCH1** may thus be considered as providing threshold voltage sensing and producing a control signal $V_D$ responsive to the sensed threshold voltage of transistor NCH1.

As power is initially supplied, the control signal $V_D$ is lower than the voltage reference $V_R$. Transistor NCH2 is biased off and the voltage $V_O$ is equal to $V_{DD}$ which, in turn, is coupled to the gate of MOSFET PCH2 as illustrated. Since PCH2 is thus biased off, there is no current charging the capacitor C, and $V_{BIAS}$ is at 0 volts. As time passes, the current $I_{ds}$ charges the gate and drain of transistor NCH1. Transistor NCH2 remains off as long as the control voltage $V_D$ is smaller than the reference voltage $V_R$. Transistor NCH2 has its drain connected to $V_{DD}$ through resistor R1.

When $V_D$ reaches $V_R$ and a little beyond, the transistor NCH2 starts to turn on and therefore transistor PCH2 is turned on thereby charging the capacitor C. Accordingly, $V_{BIAS}$ starts to rise. As a result, the well bias of transistor NCH1 starts to rise and the control voltage $V_D$ will fall. In other words, the loop adjusts $V_D$ to converge to the reference voltage $V_R$ and to stabilize at $V_R$.

After convergence, the control voltage $V_D$ will equal the reference voltage $V_R$ and this becomes the effective threshold voltage of the sensing transistor NCH1. Since the wells of all of the n-channel MOSFETS 12 are subjected to the same bias, all of these transistors will have the same effective threshold voltage $Vt_{EFF}$ equal to the reference voltage $V_R$, as would be readily appreciated by those skilled in the art.

The effective threshold voltage is equal to the reference voltage independent of the actual or initial threshold voltage resulting from the manufacturing process. Even with temperature changes, and as the threshold voltages of the transistors would otherwise be changing, the circuit in accordance with the present invention maintains the effective threshold voltage at the reference voltage.

Another aspect of the present invention is that the initial threshold voltages may be desirably targeted high in the manufacturing process. The active sensing and biasing circuit 10*a* brings the threshold voltages down to the desired level. In addition, as shown in the illustrated embodiment, the voltage reference $V_R$ can be supplied by the on-chip resistor voltage divider composed of resistors R2 and R3. The reference voltage $V_R$ is applied to the gate of transistor NCH3 which has its drain connected to $V_{DD}$ and its source connected to the drain of transistor NCH4 and the source of NCH2 as illustrated. Alternately, the voltage reference may be supplied from off-chip via the illustrated pin 16.

The lower circuit portion of FIG. 1 illustrates a sensing and biasing circuit 10*b* for a plurality of p-channel MOSFETs 13. The transistor channel types and various voltages are reversed from the upper circuit portion 10*a* as would be readily understood by those skilled in the art. Prime notation is used to indicate similar components and quantities in the lower circuit portion 10*b*; accordingly, this circuit will be readily appreciated by those skilled in the art without further description.

Figure 2:
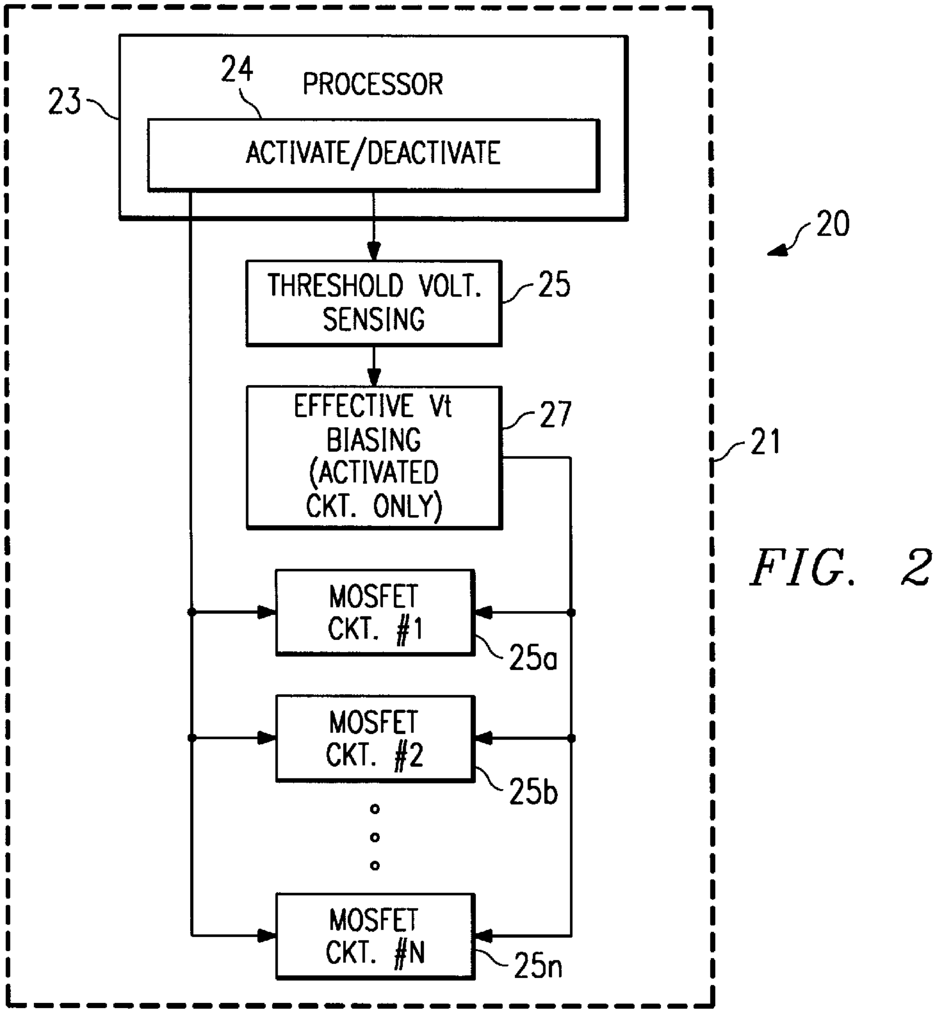
FIG. 2 is a schematic block diagram of another embodiment of an integrated circuit in accordance with the present invention.

Turning now additionally to FIG. 2 another aspect of the present invention is further described. The illustrated integrated circuit 20 includes a substrate 21 upon which the various components are formed. More particularly, the circuit includes the illustrated processor 23 and a plurality of circuit portions 25*a*–25*n* connected thereto. The circuit portions 25*a*–25*n* may be selectively turned on by the activate/deactivate circuit portion 24 of the processor 23 in the illustrated embodiment. Each of the circuit portions includes a plurality of MOSFETs therein as would be readily understood by those skilled in the art. The illustrated circuit 20 includes the threshold voltage sensing circuit 25 and which may preferably include the first and second MOSFETs NCH1, PCH1 (FIG. 1) as described in greater detail above.

The illustrated circuit 20 also includes active circuit effective threshold biasing means 27 which biases only those circuit portions which are on or activated to thereby conserve power. Such power conservation may be especially important for battery powered portable devices, such as a cellular telephone, for example. In such devices, not all circuit portions may be required to be operating at the same time, and battery power may also be limited.

Control of the biasing may be based upon sensing power applied to the activated circuit portions 25*a*–25*n*. Alternately, the biasing could be controlled responsive to signals received from the processor 23 as would be readily understood by those skilled in the art.

Although the illustrated circuit 20 is an integrated circuit, the present invention may also be implemented on a plurality of integrated circuits connected together. In other words, the processor and/or sensing and biasing circuit, and circuit portions may be on different integrated circuits. Of course, the sensing and biasing are preferably at least individual to an integrated circuit to thereby account for the variations in threshold voltage introduced by processing as would also be readily understood by those skilled in the art.

Figure 3:
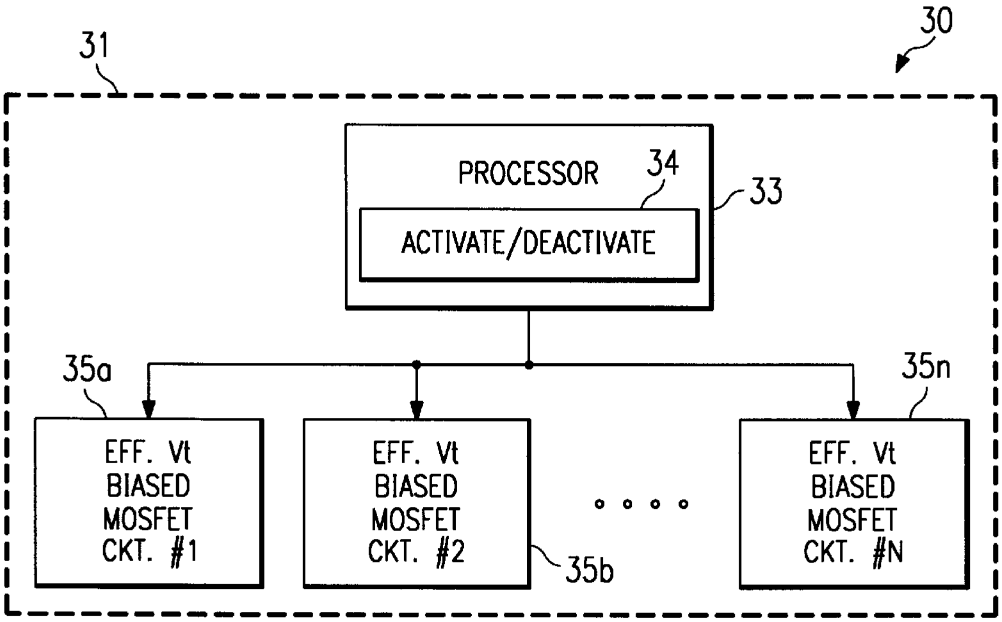
FIG. 3 is a schematic block diagram of yet another embodiment of an integrated circuit in accordance with the present invention.

Turning now to FIG. 3 another embodiment of a circuit 30 also having power conservation in accordance with the invention is now described. In this embodiment, a processor 33 and its associated activate/deactivate circuit 34 are incorporated. However, in this embodiment the sensing and biasing circuits are illustratively incorporated with each circuit portion 35*a*–35*n*.

One method aspect of the invention is for making and operating an integrated circuit and can be better understood with reference to FIG. 1, for example. The method preferably comprises the steps of: forming a plurality of MOSFETs 12 on a substrate 11 with each having an initial threshold voltage and a channel of a first conductivity type; forming a first MOSFET NCH1 on the substrate having an initial threshold voltage and a channel of the first conductivity type; generating a control signal $V_D$ related to an effective threshold voltage of the first MOSFET; and applying a bias voltage to the plurality of MOSFETs and to the first MOSFET based upon the control signal to set an effective threshold voltage of the first plurality of MOSFETs to have an absolute value less than an absolute value of the initial threshold voltage.

Another method in accordance with the invention is for making and operating a circuit for enhancing power conservation and may be better appreciated with reference to FIG. 2, for example. The method preferably comprises the steps of: forming a plurality of circuit portions 25*a*–25*n* on a substrate 21, each of the circuit portions comprising a respective plurality of enhancement-mode metal-oxide semiconductor field-effect transistors (MOSFETs), and each MOSFET having an initial threshold voltage; selectively activating and deactivating ones of the plurality of circuit portions; and only biasing respective MOSFETs of activated circuit portions to set an effective threshold voltage of the respective MOSFETs different than an initial threshold voltage, and not biasing respective MOSFETs of deactivated circuit portions to thereby conserve power.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. An integrated circuit comprising:

a substrate;

a first plurality of enhancement-mode metal-oxide semiconductor field-effect transistors (MOSFETs) on said substrate, and each of the first plurality of MOSFETs having a first initial threshold voltage and a channel of a first conductivity type;

a first MOSFET on said substrate having the first initial threshold voltage and a channel of the first conductivity type;

a second MOSFET on said substrate and having a channel of a second conductivity type, said second MOSFET being biased to a pinch-off region and being connected to said first MOSFET for generating a first control signal related to an effective threshold voltage of the first MOSFET; and first effective threshold bias means for generating a first bias voltage to said first plurality of MOSFETs and to said first MOSFET based upon the first control signal to set a first desired effective threshold voltage of said first plurality of MOSFETs to have an absolute value less than an absolute value of the first initial threshold voltage.

2. An integrated circuit according to claim 1 wherein said first MOSFET comprises a drain and gate connected together; and wherein said second MOSFET comprises a drain connected to the drain and gate of said first MOSFET.

3. An integrated circuit according to claim 1 wherein said second MOSFET has a predetermined relatively long and narrow channel so as to supply a current less than about 1 microampere.

4. An integrated circuit according to claim 1 wherein said first effective threshold bias means comprises:

first difference means for determining a difference between the first control signal and a first reference voltage; and first converging bias means for generating the first bias voltage responsive to said first difference means to bias the first MOSFET and said first plurality of MOSFETs to converge to the first desired effective threshold voltage substantially equal to the first reference voltage.

5. An integrated circuit according to claim 4 wherein said first converging bias means comprises a third MOSFET and a first capacitor connected thereto.

6. An integrated circuit according to claim 4 wherein said first effective threshold bias means further comprises a first reference voltage generating means on said substrate for generating the first reference voltage.

7. An integrated circuit according to claim 6 wherein said first reference voltage generating means comprises a first plurality of resistors configured as a voltage divider.

8. An integrated circuit according to claim 1 further comprising:

a second plurality of MOSFETs on said substrate, and each of the second plurality of MOSFETs having a second initial threshold voltage and a channel of a second conductivity type;

a fourth MOSFET on said substrate having the second initial threshold voltage and a channel of the second conductivity type;

a fifth MOSFET on said substrate and having a channel of the first conductivity type, said fifth MOSFET being biased to a pinch-off region and being connected to said fourth MOSFET for generating a second control signal related to an effective threshold voltage of the fourth MOSFET; and second effective threshold bias means for generating a second bias voltage to said second plurality of MOSFETs and to said fourth MOSFET based upon the second control signal to set a second desired effective threshold voltage of said second plurality of MOSFETs to have an absolute value less than an absolute value of the second initial threshold voltage.

9. An integrated circuit according to claim 8 wherein said fourth MOSFET comprises a drain and gate connected together; and wherein said fifth MOSFET comprises a drain connected to the drain and gate of said fourth MOSFET.

10. An integrated circuit according to claim 8 wherein said fifth MOSFET has a predetermined relatively long and narrow channel so as to supply current less than about 1 microampere.

11. An integrated circuit according to claim 8 wherein said second effective threshold bias means comprises:

second difference means for determining a difference between the second control signal and a second reference voltage; and second converging bias means for generating the second bias voltage responsive to said second difference means to bias the fourth MOSFET and said second plurality of MOSFETs to converge to the second desired effective threshold voltage substantially equal to the second reference voltage.

12. An integrated circuit according to claim 11 wherein said second converging bias means comprises a sixth MOSFET and a second capacitor connected thereto.

13. An integrated circuit according to claim 11 wherein said second effective threshold bias means further comprises second reference voltage generating means on said substrate for generating the second reference voltage.

14. An integrated circuit according to claim 13 wherein said second reference voltage generating means comprises a second plurality of resistors configured as a voltage divider.

15. An integrated circuit comprising:

a substrate;

a plurality of enhancement-mode metal-oxide semiconductor field-effect transistors (MOSFETs) on said substrate, and each MOSFET having an initial threshold voltage and a channel of a first conductivity type;

threshold voltage sensing means comprising a first MOSFET on said substrate having the initial threshold voltage and a channel of the first conductivity type for generating a control signal related to an effective threshold voltage of the first MOSFET, wherein said first MOSFET comprises a drain and gate connected together, a second MOSFET on said substrate and having a channel of a second conductivity type, wherein said second MOSFET is biased to a pinch-off region, and wherein said second MOSFET comprises a drain connected to the drain and gate of said first MOSFET; and effective threshold bias means for generating a bias voltage to said plurality of MOSFETs and to said first MOSFET based upon the control signal to set a desired effective threshold voltage of said plurality of MOSFETs to have an absolute value less than an absolute value of the initial threshold voltage.

16. An integrated circuit according to claim 15 wherein said second MOSFET has a predetermined relatively long and narrow channel so as to supply current less than about 1 microampere.

17. An integrated circuit according to claim 15 wherein said effective threshold bias means comprises:

difference means for determining a difference between the control signal and a reference voltage; and converging bias means for generating the bias voltage responsive to said difference means to bias the first MOSFET and said plurality of MOSFETs to converge to the desired effective threshold voltage substantially equal to the reference voltage.

18. An integrated circuit according to claim 17 wherein said converging bias means comprises a third MOSFET and a capacitor connected thereto.

19. An integrated circuit according to claim 17 wherein said effective threshold bias means further comprises reference voltage generating means on said substrate for generating the reference voltage.

20. An integrated circuit according to claim 19 wherein said reference voltage generating means comprises a plurality of resistors configured as a voltage divider.

21. A circuit comprising:

a plurality of circuit portions, each circuit portion comprising a respective plurality of enhancement-mode metal-oxide semiconductor field-effect transistors (MOSFETs), and each MOSFET having an initial threshold voltage;

processor means for selectively activating and deactivating ones of said plurality of circuit portions; and activated circuit effective threshold bias means for only biasing respective MOSFETs of activated circuit portions to an effective threshold voltage different than the initial threshold voltage, and for not biasing respective MOSFETs of deactivated circuit portions to thereby conserve power.

22. A circuit according to claim 21 further comprises:

a first MOSFET comprising a drain and a gate connected together; and a second MOSFET being biased to a pinch-off region and comprising a drain connected to the drain and gate of said first MOSFET to generate a control signal to said activated circuit effective threshold bias means related to an effective threshold voltage of the first MOSFET.

23. A circuit according to claim 22 wherein said activated circuit effective threshold bias means comprises means for generating the bias voltage to said plurality of MOSFETs of activated circuit portions and to said first MOSFET based upon the control signal to the effective threshold voltage having an absolute value less than an absolute value of the initial threshold voltage.

24. A circuit according to claim 22 wherein said second MOSFET has a predetermined relatively long and narrow channel so as to supply current in a range of less than about 1 microampere.

25. A circuit according to claim 24 wherein said activated circuit effective threshold bias means comprises:

difference means for determining a difference between the control signal and a reference voltage; and converging bias means for generating the bias voltage responsive to said difference means to bias the first MOSFET and said plurality of MOSFETs of activated circuit portions to converge to the effective threshold voltage substantially equal to the reference voltage.

26. A circuit according to claim 25 wherein said converging bias means comprises a third MOSFET and a capacitor connected thereto.

27. A circuit according to claim 25 wherein said activated circuit effective threshold bias means further comprises reference voltage generating means for generating the reference voltage.

28. A circuit according to claim 25 wherein each of said plurality of MOSFETs comprises MOSFETs having channels of a first conductivity type; and wherein said first MOSFET has a channel of the first conductivity type.

29. A circuit according to claim 28 wherein said second MOSFET has a channel of a second conductivity type.

30. A method for making and operating an integrated circuit comprising the steps of:

forming a plurality of enhancement-mode metal-oxide semiconductor field-effect transistors (MOSFETs) on a substrate, and each MOSFET having an initial threshold voltage and a channel of a first conductivity type;

forming a first MOSFET on the substrate having the initial threshold voltage and a channel of the first conductivity type;

forming a second MOSFET on the substrate and having a channel of a second conductivity type and being connected to the first MOSFET, wherein the second MOSFET is biased to a pinch-off region, for generating a control signal relating to an effective threshold voltage of the first MOSFET; and applying a bias voltage to the plurality of MOSFETs and to the first MOSFET based upon the control signal to set a desired effective threshold voltage of the plurality of MOSFETs to have an absolute value less than an absolute value of the initial threshold voltage.

31. A method according to claim 30 wherein the steps of forming the first MOSFET and the plurality of MOSFETs comprises forming the first MOSFET and the plurality of MOSFETs to all have the initial threshold voltage above the desired effective threshold voltage.

32. A method according to claim 30 wherein the step of forming the second MOSFET comprises forming the second MOSFET to have a predetermined relatively long and narrow channel so as to supply current less than about 1 microampere.

33. A method according to claim 30 wherein the step of applying the bias voltage comprises the steps of:

determining a difference between the control signal and a reference voltage; and generating the bias voltage responsive to the difference between the control signal and the reference voltage to bias the first MOSFET and said plurality of MOSFETs to converge to the desired effective threshold voltage substantially equal to the reference voltage.

34. A method for making and operating a circuit comprising the steps of:

forming a plurality of circuit portions, each of the circuit portions comprising a respective plurality of enhancement-mode metal-oxide semiconductor field-effect transistors (MOSFETs), and each MOSFET having an initial threshold voltage;

selectively activating and deactivating ones of the plurality of circuit portions; and only biasing respective MOSFETs of activated circuit portions to set a desired effective threshold voltage of the respective MOSFETs different than the initial threshold voltage, and not biasing respective MOSFETs of deactivated circuit portions to thereby conserve power.

35. A method according to claim 34 wherein the step of only biasing respective MOSFETs of activated circuit portions further comprises the steps of:

forming a first MOSFET comprising a drain and a gate connected together; and forming a second MOSFET comprising a drain connected to the drain and gate of the first MOSFET; and operating the first and second MOSFETs to generate a control signal related to the desired effective threshold voltage of the first MOSFET.

36. A method according to claim 35 wherein the step of only biasing respective MOSFETs of activated circuit portions comprises biasing the plurality of MOSFETs and the first MOSFET based upon the control signal to set the desired effective threshold voltage of the plurality of MOSFETs to have an absolute value less than an absolute value of the initial threshold voltage.

* * * * *